US009891270B2

(12) United States Patent
Curry et al.

(10) Patent No.: US 9,891,270 B2
(45) Date of Patent: Feb. 13, 2018

(54) HIGH POWER LASER DIODE TEST SYSTEM AND METHOD OF MANUFACTURE

(71) Applicant: Newport Corporation, Irivne, CA (US)

(72) Inventors: John Curry, Bozeman, MT (US); Christopher Cole Chandler, Bozeman, MT (US); Wade P Watts, Bozeman, MT (US); Nicholas Donnie Harriott, Belgrade, MT (US)

(73) Assignee: Newport Corporation, Irvine, CA (US)

( * ) Notice: Subject to any disclaimer, the term of this patent is extended or adjusted under 35 U.S.C. 154(b) by 0 days.

(21) Appl. No.: 15/338,383

(22) Filed: Oct. 29, 2016

(65) Prior Publication Data

US 2017/0123000 A1 May 4, 2017

Related U.S. Application Data

(60) Provisional application No. 62/249,188, filed on Oct. 31, 2015.

(51) Int. Cl.
*G01R 31/28* (2006.01)
*G01R 31/26* (2014.01)
*H01S 5/00* (2006.01)

(52) U.S. Cl.
CPC ..... *G01R 31/2875* (2013.01); *G01R 31/2635* (2013.01); *H01S 5/0014* (2013.01)

(58) Field of Classification Search
CPC .. G01N 33/004; G01J 3/4406; G01F 23/2928; G01M 11/3145
See application file for complete search history.

(56) References Cited

U.S. PATENT DOCUMENTS

| | | | |
|---|---|---|---|
| 6,797,936 B1* | 9/2004 | Kessler | G01R 31/01 250/221 |
| 2004/0066504 A1* | 4/2004 | Farnsworth | G01J 1/4257 356/121 |
| 2005/0013233 A1* | 1/2005 | Chou | G11B 7/1267 369/116 |
| 2013/0236087 A1* | 9/2013 | Lee | G01R 31/2601 382/149 |

\* cited by examiner

*Primary Examiner* — Jermele M Hollington
*Assistant Examiner* — Alvaro Fortich
(74) *Attorney, Agent, or Firm* — Brian F. Swienton

(57) ABSTRACT

A high power laser diode test system is disclosed which includes a housing body defining at least one device test module compartment therein, a power supply, the system controller, and thermal control system positioned within the device test module compartment, a device test module having at least one carrier device receiver formed therein detachably coupled to the housing body, and at least one carrier device configured to support at least one laser diode device coupled thereto detachably positioned within the carrier device port formed on the device test module.

26 Claims, 19 Drawing Sheets

HIGH POWER LASER DIODE TEST SYSTEM AND METHOD OF MANUFACTURE

CROSS-REFERENCE TO RELATED APPLICATIONS

The present application claims priority to U.S. Provisional Patent Appl. Ser. No. 62/249,188, entitled "High Power Laser Diode Test System and Method of Manufacture," filed on Oct. 31, 2015, the entire contents of which are incorporated by reference herein.

BACKGROUND

Semiconductor laser diodes are presently used in an ever increasing number of applications. Typically, their small size, relative high power, operational lifetime, and device cost offer several advantages over alternate laser sources. Often, during the manufacturing process laser diode devices are subjected to a 'burn-in" process wherein the laser diode devices are subjected to varying levels of electric current and/or temperature gradients to characterize the optical characteristics of the semiconductor laser diode.

Presently, there are a number of laser diode burn-in racks or systems available. While the prior art burn-in racks have proven useful, a number of shortcomings have been identified. For example, precise positioning of the laser diode and controlling the temperature of the laser diode under test has proven problematic. As such, precise characterization of the laser diode has been difficult.

In light of the foregoing, there is an ongoing need for a laser diode test system capable of quickly and accurately characterizing multiple laser diodes.

SUMMARY

The present application is directed to a high power laser diode test system useful in characterizing the performance of one or more laser diode devices. In one embodiment, the present application discloses a high power laser diode test system and includes a housing body defining at least one device test module compartment therein. A power supply configured to provide power to one or more components, device test modules, controllers, and the like may be positioned within the housing body. A system controller and thermal control system may also be positioned within the housing body. At least one interconnect system operably couples the system controller and thermal control system to the power supply. At least one device test module may be positioned within the device test module compartment formed in the housing body and coupled to at least one of the power supply, the system controller, and the thermal control system via the system interconnect. The device test module includes at least one carrier device receiver formed therein. At least one carrier device configured to support at least one laser diode device coupled thereto may be inserted into the carrier device port formed on the device test module. The carrier device is in communication with at least one of the power supply, the system controller, and thermal control system via the device test module.

In another embodiment, the present application is directed to a device test module for use within a high power laser diode test system. The device test module includes at least one device test module faceplate configured to be coupled to a high power laser diode test system. At least one carrier device port is formed on the device test module faceplate. The device test module further includes at least one lower assembly coupled to the at least one device test module faceplate. The lower assembly includes a clamp base plate, a clamp alignment body, and at least one fluid bladder positioned between the clamp base plate and the clamp alignment body. The fluid bladder is in communication with at least one least one bladder inflation system such that the fluid bladder can be selectively inflated. As such, the bladder inflation system is in communication with at least one power supply coupled to a high power laser diode test system. The device test module further includes at least one upper assembly coupled to the device test module faceplate and may be positioned proximate to the lower assembly. The upper assembly includes at least one thermal control circuit and at least one electrical connection system thereon. The lower assembly and the upper assembly cooperatively form at least one carrier device receiver configured to receive the carrier device therein. Lastly, the device test module includes at least one carrier device configured to have at least one laser diode coupled thereto. The laser diode may be detachably coupled to the electrical connection system located on the upper assembly.

Lastly, the present application is directed to a carrier device for use in a high power laser diode test system. The carrier device includes at least one carrier device faceplate coupled to at least one carrier device body. The carrier device includes at least one device positioning member coupled to at least one of the carrier device faceplate and the carrier device body. The device positioning member may be configured to have one or more laser diodes detachably coupled thereto. At least one carrier device piston is movable coupled to the carrier device body. During use, the carrier device piston is configured to engage at least a portion of a device test module. At least one contact device body may be positioned on or adjacent to the carrier device body. The contact device body may be configured to be selectively engaged by the carrier device piston and engage at least one upper plate assembly within the device test module thereby coupling the carrier device to the device test module.

Other features and advantages of the high power laser diode test system and method of manufacture as described herein will become more apparent from a consideration of the following detailed description.

BRIEF DESCRIPTION OF THE DRAWINGS

Various embodiments of the high power laser diode test system and method of manufacture will be explained in more detail by way of the accompanying drawings, wherein.

DETAILED DESCRIPTION

Figure 1:
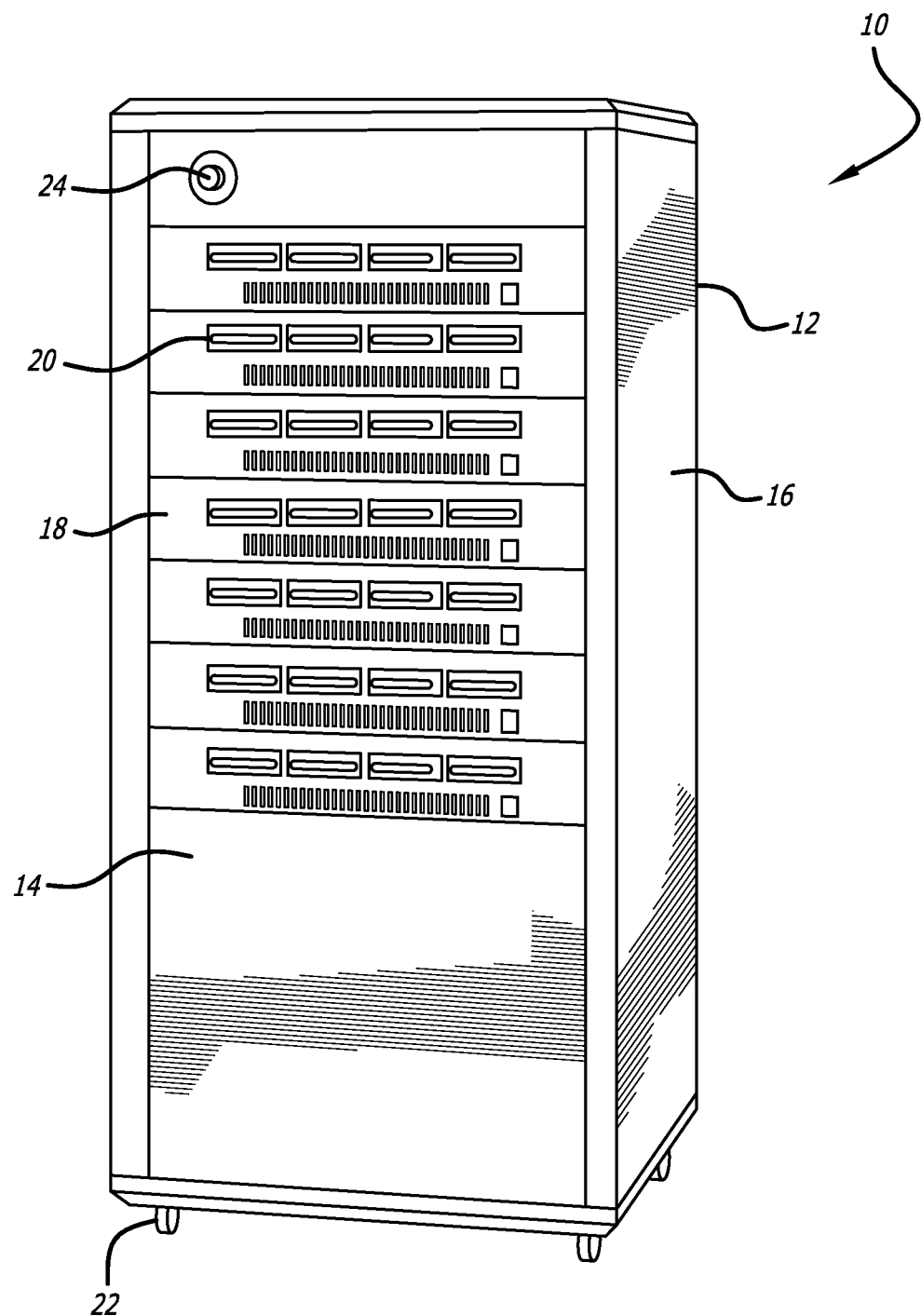
FIG. 1 shows a perspective view of an embodiment of a modular high power laser diode test system having seven (7) device test module inserted therein, each device test module having four (4) carrier devices inserted therein.

FIG. 1 shows a perspective view of an embodiment of a high power laser diode test system. As shown, the laser diode test system 10 (hereinafter called "test system") includes at least one housing body 12 having at least one front panel 14 and at least one body panel or side panel 16. As shown in FIG. 1, one or more device test modules 18 may be coupled to or otherwise inserted into the housing body 12 of the test system 10. The device test modules 18 may be configured to receive one or more carrier devices 20 therein or coupled thereto. For example, in the illustrated embodiment each device test module 18 is configured to receive and support four (4) carrier devices 20 therein, although each device test module 18 may be easily adapted to receive and support any number of carrier devices 20 therein. Further, in the illustrated embodiment, the carrier devices 20 are of substantially uniform shapes, transverse dimensions, and the like. In another embodiment, the carrier devices 20 need not be of a uniform shape and/or dimension relative at least one other carrier device 20. As such, at least one of the device test modules 18 may be configured to receive carrier devices 20 having any variety of shapes, transverse dimension, and the like therein. In the illustrated embodiment, seven (7) device test modules 18 are inserted through or positioned proximate to the front panel 14 of the test system 10. Those skilled in the art will appreciate that any number of device test modules 18 may be inserted into or otherwise in communication with the test system 10. In the illustrated embodiment the housing body 12 of the test system 10 includes one or more supports 22 positioned thereon. Optionally, the test system 10 may include one or more casters, supports, skids, legs, and the like positioned at any variety of locations on the test system 10. Further, in the illustrated embodiment, one or more operation actuators or systems 24 may be positioned at any location of the test system 10. In the illustrated embodiment, the operation actuator 24 comprises an on/off button positioned on the front panel of the body. In another embodiment, the operation actuator 24 comprises one or more lights, circuit breakers, horns, display devices, computer monitors, keyboards, or similar devices configured to alert users that a test or similar operation is under way and/or provide the user with data relating the operation of the test system 10.

Figure 2:
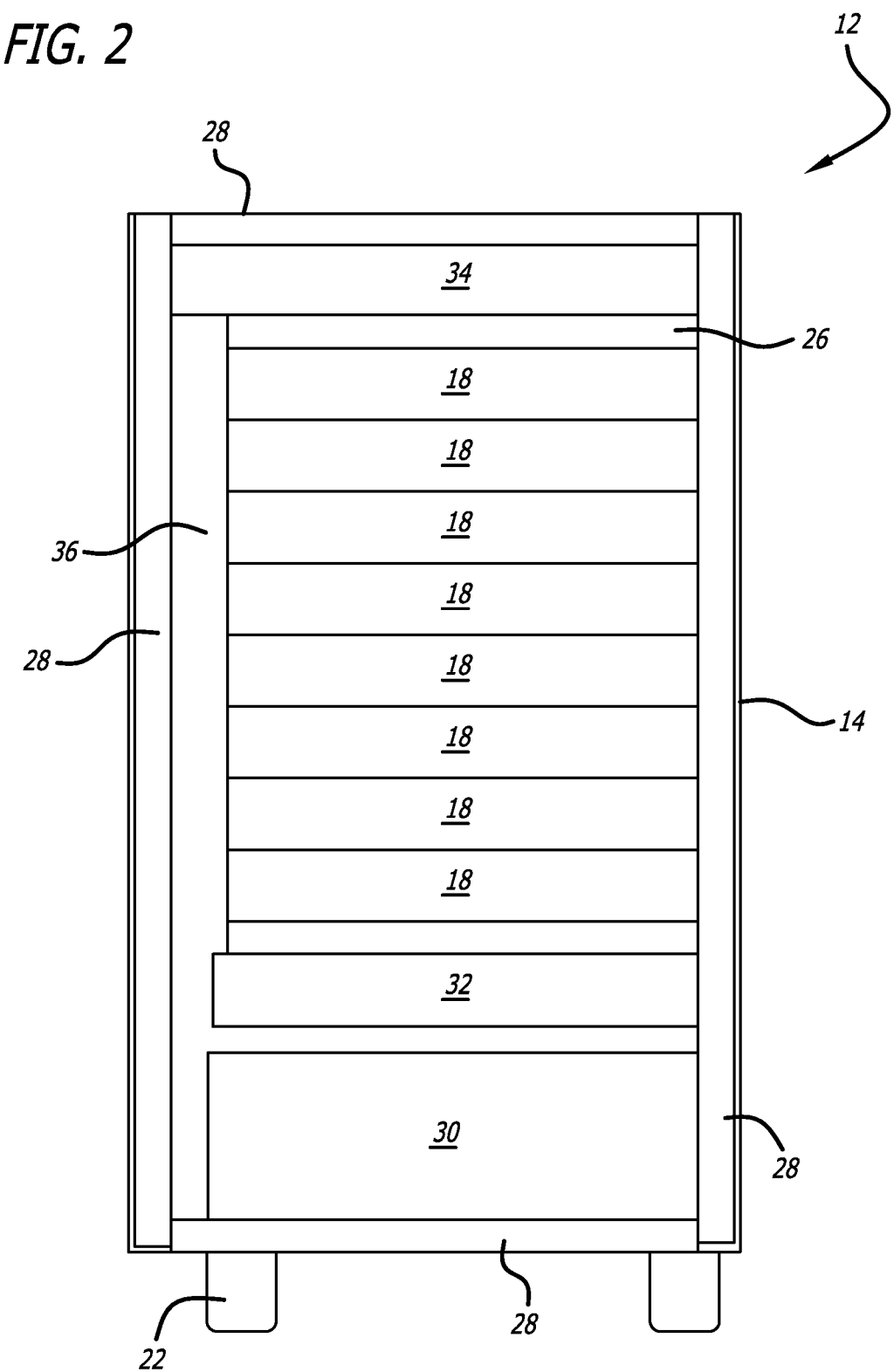
FIG. 2 shows a planar side view of an embodiment of a modular high power laser diode test system having a side panel removed wherein the internal components and subsystems of the test system are visible.

FIG. 2 shows a side view of the internal components of an embodiment of the test system 10 shown in FIG. 1. In the illustrated embodiment, the housing body 12 defines at least one device test module compartment 26 sized to receive one or more device test modules 18 therein. In the illustrated embodiment, seven (7) device test modules 18 are positioned within the device test module compartment 26 formed in the housing body 12. In another embodiment, nine (9) device test modules 18 are positioned within the device test module compartment 26 formed in the housing body 12. Optionally, any number of device test modules 18 may be positioned within the device test module compartment 26 formed in the housing body 12. As shown in FIG. 2, the device test module compartment 26 may be formed by at least one of the front panel 14 and body panels 16. In addition, one or more frame and/or scaffold members 28 may be included within the housing body 12. In one embodiment, the frame members 28 may be configured to support one or more front panels 14, body panels 16, device test modules 18, and/or various other components used in the test system 10. As such, the frame members 28 may be configured to define at least a portion of the device test module compartment 26.

Referring again to FIG. 2, the test system 10 may include at least one thermal control system 30 therein. In one embodiment, the thermal control system 30 may include one or more thermocouples, thermostats, and thermal control processors, and the like. Further, the thermal control system 30 may include one or more fans, chillers, heaters, fluid sources, fluid tanks, fluid pumps, sensors, and the like. As such, in one embodiment the test system 10 may be in communication with one or more fluid sources or reservoirs, power sources, or both. Similarly, the test system 10 may include various hoses, conduits, and the like therein. Optionally, the thermal control system 30 may be coupled to at least one of the front panel 14, body panels 16, device test modules 18, and frame members 28. Optionally, distributed thermal control system architecture may be used with the present test system. For example, each device test module 18 may include a dedicated thermal control system therein, the internal thermal control system configured to manage the thermal environment within the device test module 18. As such, neighboring device test modules 18 may be operating under different thermal environments simultaneously.

As shown in FIG. 2, the test system 10 may also include one or more system power supplies, voltage regulators, current regulators, and the like therein. For example, in the illustrated embodiment, the test system 10 includes a power supply 32 configured to provide power to one or more systems, components, indicators, and/or test modules 18 positioned on or within the test system 10. For example, in one embodiment, the power supply 32 is configured to provide alternating current (AC current) to at least one of the device test modules 18, carrier devices 20, operation actuators 24, thermal control system 30, or other subsystems included within the test system 10. In addition, the power supply 32 may be configured to provide direct current (DC current) to at least one subsystem included within the test system 10. In addition, the test system 10 may include at least one control system or processor 34 therein. In one embodiment, the control system 34 provides internal processing capacity capable of regulating the test operations as defined by the user, storing test data, providing data to internal or external processors, monitors various sensors, memory devices, displays, and the like. As such, the control system 34 may be communication with the power supply 32. For example, in one embodiment, the control system 34 is in communication with at least one external computer, processor, or computer network. In addition, the control system 34 may be in communication with one or more internal systems, including, for example, the operation actuator 24, thermal control system 30, power supply 32, and test module 18. The control system 34 may be configured to communication with at least one of the thermal control system 30, power supply 32, test module 18, and/or external computer or network wirelessly. Optionally, like the thermal control systems 30 described above, each device test module may include a power supply 32 and/or a control system 34 positioned thereon, thereby offer a distributed power supply and/or control architecture.

In the embodiment shown in FIG. 2, the test system 10 may include at least one interconnect system 36 positioned therein. In one embodiment, the interconnect system 36 is in communication with at least one of the device test modules 18. As such, the interconnect system 36 may act as a conduit permitting the various device test modules 18 to be easily coupled to at least one of the thermal control system 30, the power supply 32, and the control system 34. In another embodiment, the interconnect system 36 permits the test system 10 to be easily tailored to a user desired configuration. Optionally, the interconnect system 36 may permit individual device test modules 18 to communicate with other device test modules 18 either positioned on the same test system 10, or, in the alternative, with any device test modules 18 coupled to any test systems sharing a common communication network. More specifically, the interconnect system 36 may be configured to permit any number of device test modules 18 to be quickly and easily coupled to and/or detached from the test system 10 and the various internal control systems (e.g. system controller 34) and operation systems (e.g. thermal control system 30, power supply 32), thereby providing a modular test system 10 which is capable of being easily reconfigured to meet the user's needs.

Figure 3:
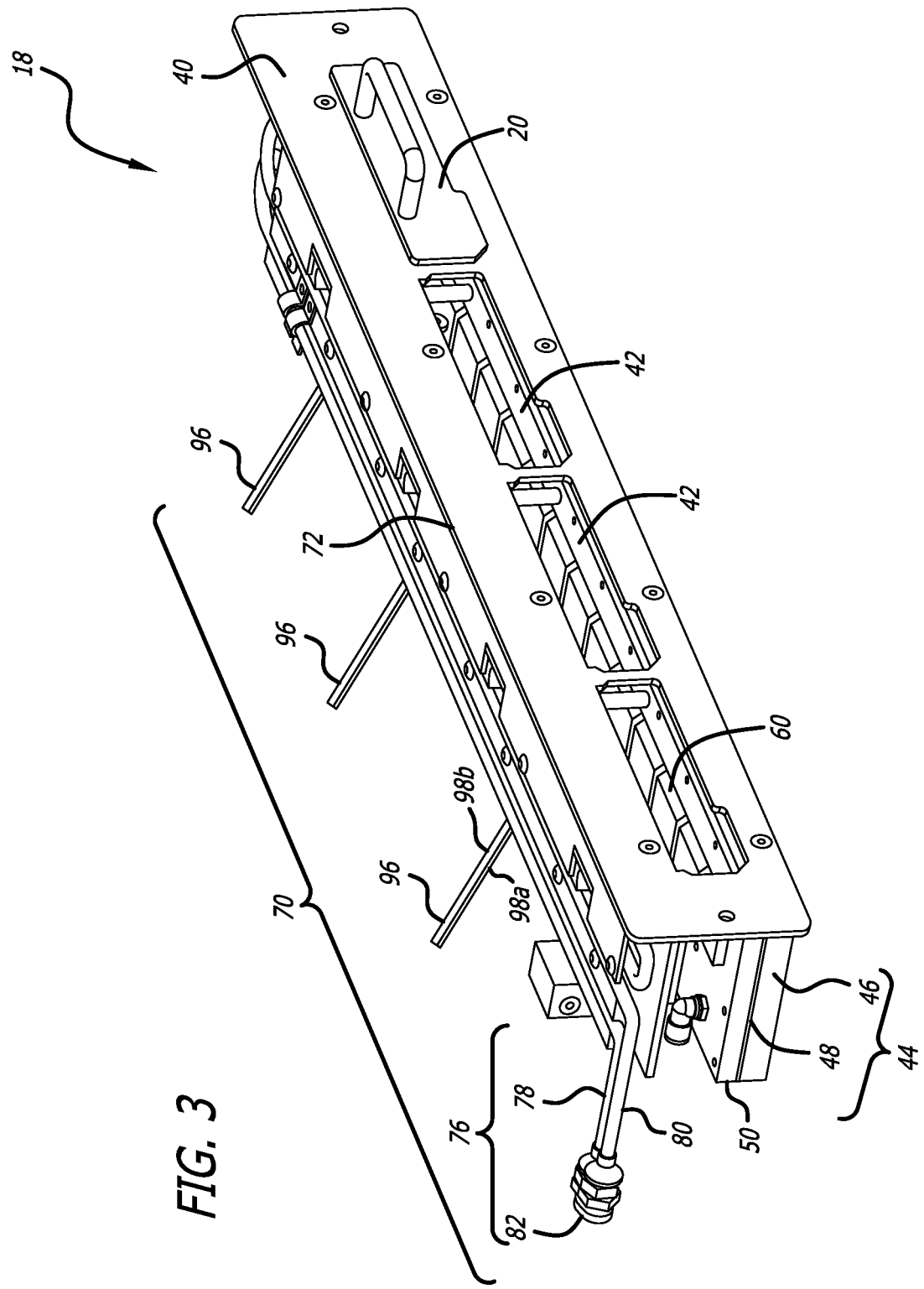
FIG. 3 shows an elevated perspective view of an embodiment of a device test module for use with the embodiments of the test system shown in FIGS. 1 and 2.

FIGS. 3-13 show various views of the components forming an embodiment of a device test module 18 for use with the test system 10. As shown in FIG. 3, the device test module 18 may include at least one device test module faceplate 40 having at least one carrier device port 42 formed therein. In the illustrated embodiment, the device test module 18 includes at least one lower assembly 44 and at least one upper assembly 70 positioned proximate to the lower assembly 44. The lower assembly 44 and upper assembly 70 may be coupled to the device test module faceplate 40 thereby forming a singular unit configured to be easily coupled to the housing body 12 and/or frame members 28 of the test system 10. In another embodiment, the device test module faceplate 40, lower assembly 44, and upper assembly 70 may be positioned within at least one device test module housing (not shown). In one embodiment, the device test module housing (not shown) may be easily and quickly coupled to the housing body 12 and/or frame members 28 of the test system 10. In the accompanying figures, the housing has not been shown to more clearly illustrate the novel features of the internal architecture of the device test module 18, although those skilled in the art will appreciate that housing may be included with the device test module 18. In the illustrated embodiments, the lower assembly 44 includes at least one clamp base plate 46 and at least one clamp alignment body 50. Further, one or more fluid bladders or inflatable compliant bodies 48 may be positioned between the clamp base plate 46 and the clamp alignment body 50. In addition, one or more clamp pistons 60 may be in communication with the bladder 48 via the clamp alignment body 50. At least one clamp piston 60 may be configured to be selectively movable in relation to the clamp alignment body 50. For example, at least one clamp piston 60 may be configured to selectively extend through clamp alignment body 50 when the bladder 48 is inflated and retract at least partially into the clamp alignment body 50 when the bladder 48 is deflated. As such, each of the clamp pistons 60 may be configured to selectively apply a substantially uniform clamping pressure to at least one carrier device 20 positioned thereon or proximate thereto. As such, unlike prior art devices, the inclusion of the bladder 48 and clamp pistons 60 in the lower assembly 44 provides a compliant lower assembly 44 configured to operably receive and accommodate carrier devices 20 having differing heights, thicknesses, transverse dimensions, and profiles therein.

Figure 4:
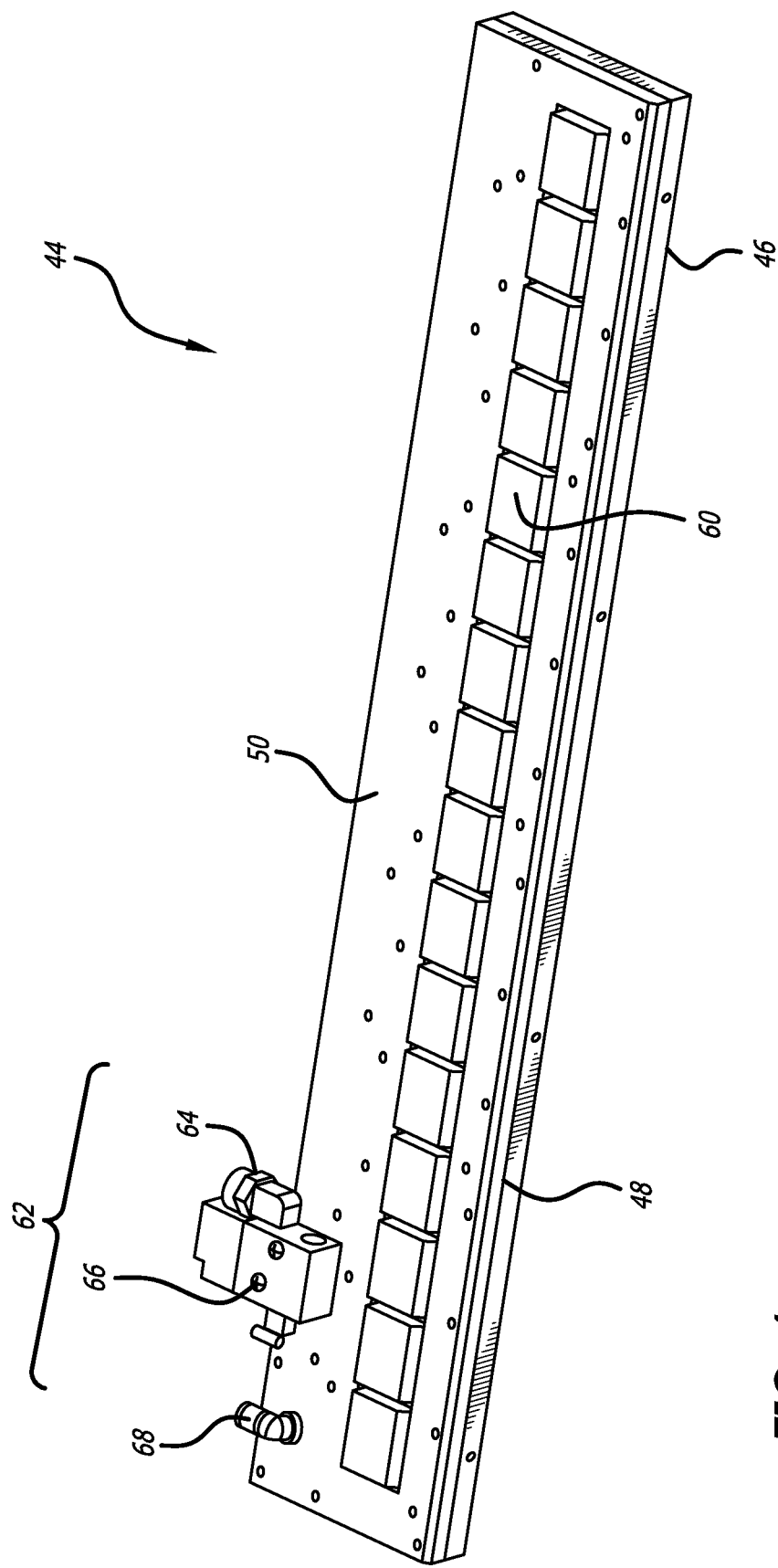
FIG. 4 shows an elevated perspective view of an embodiment of a lower assembly of the device test module shown in FIG. 3.
Figure 5:
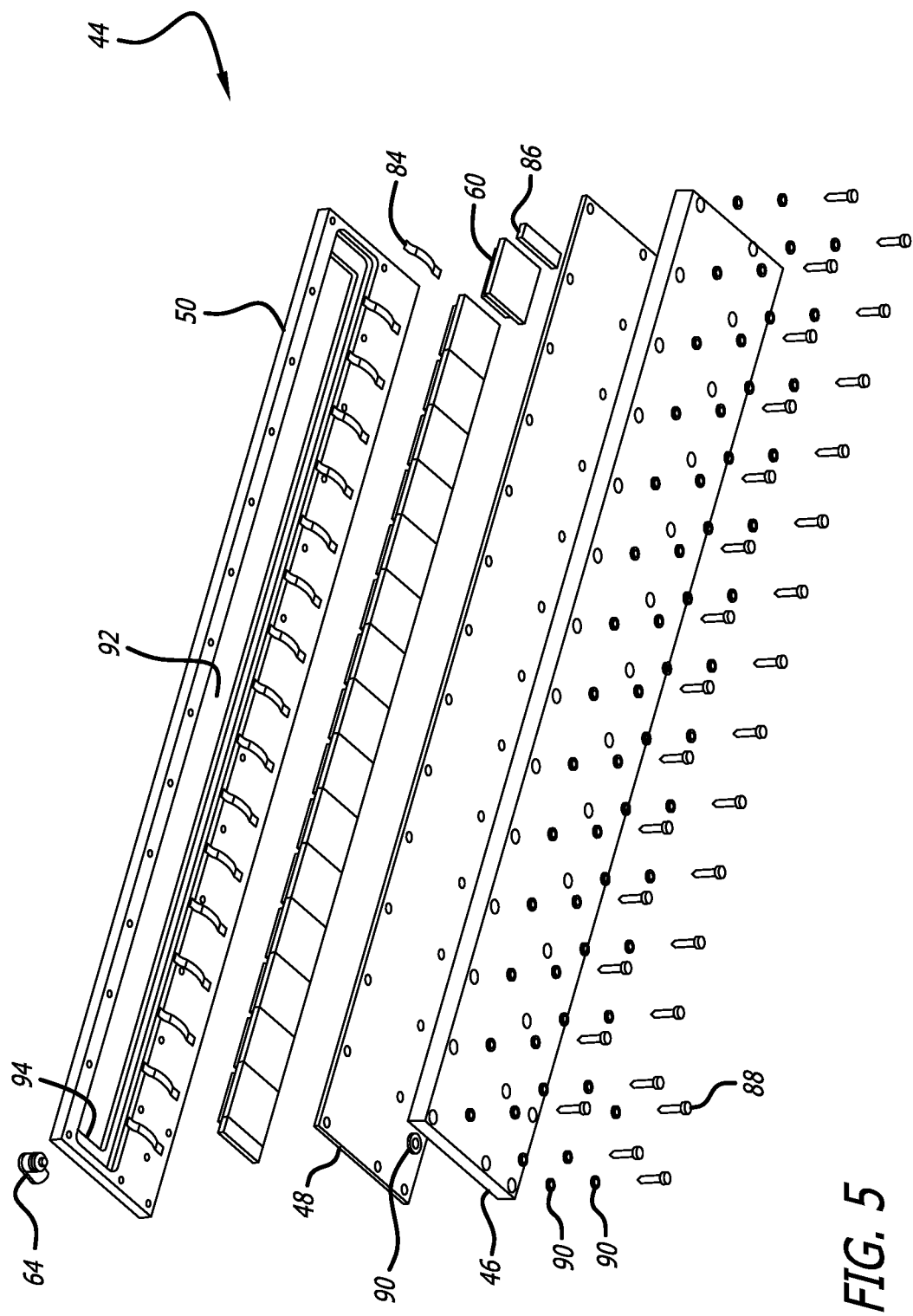
FIG. 5 shows an exploded perspective view of the components forming the embodiment of the lower assembly in FIG. 4.
Figure 6:
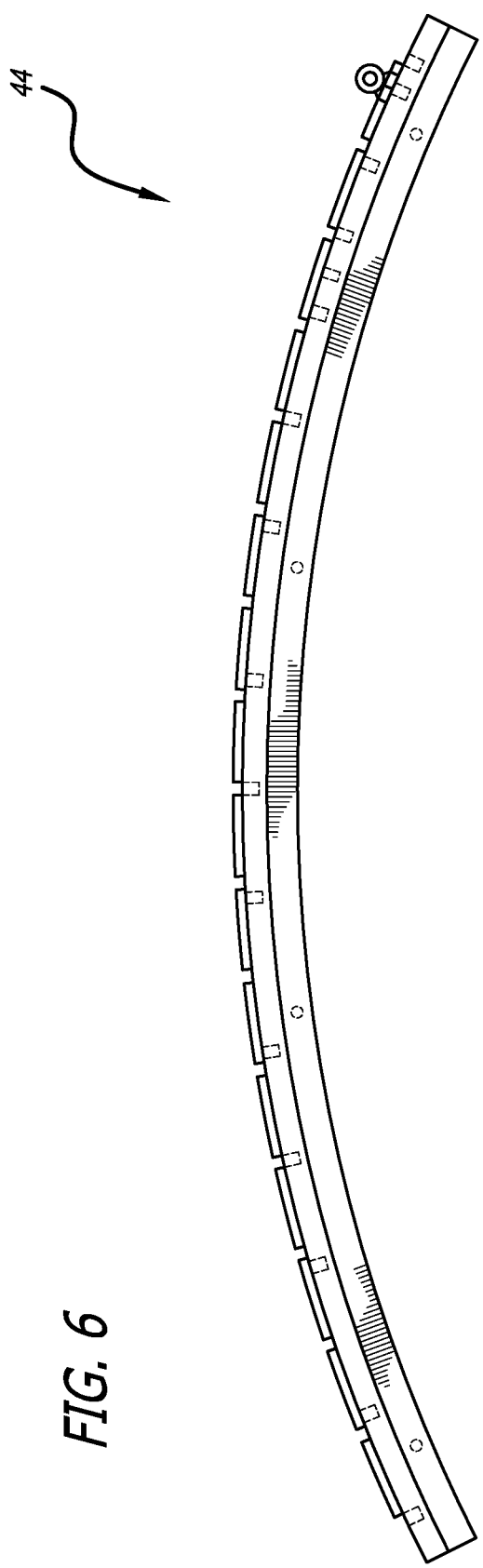
FIG. 6 shows side view of an alternate embodiment of an embodiment of a lower assembly of a device test module.
Figure 7:
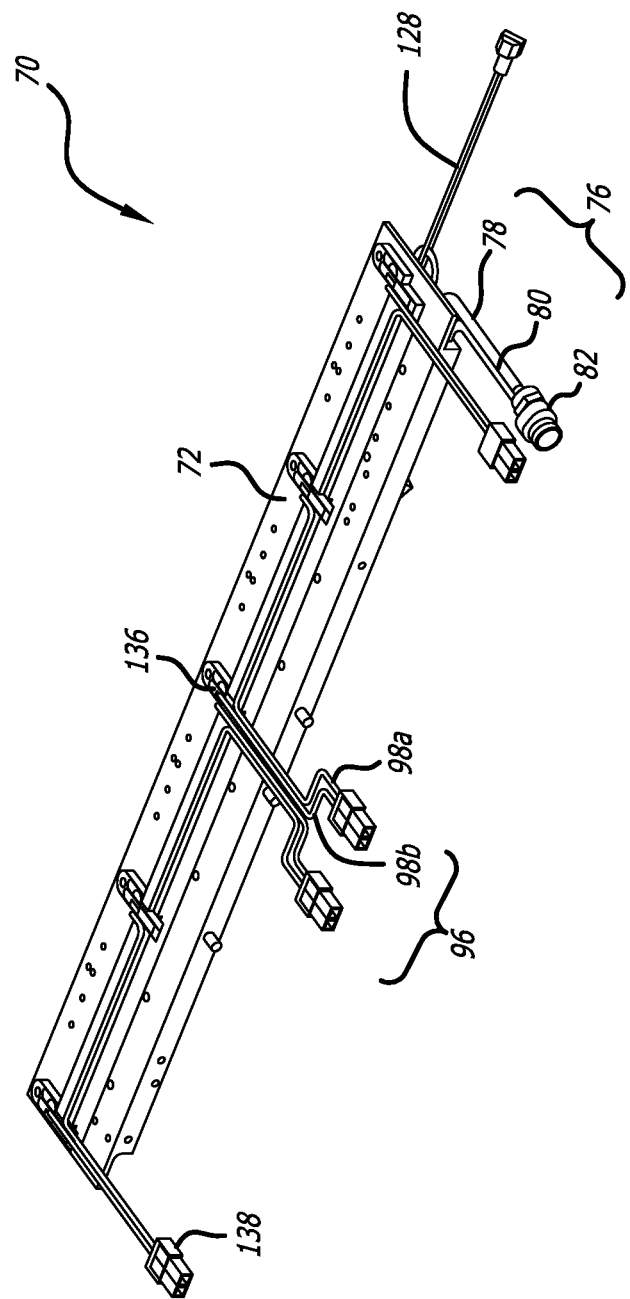
FIG. 7 shows an elevated perspective view of an embodiment of an upper assembly of the device test module shown in FIG. 3.

As shown in FIGS. 3-5, at least one bladder inflation system 62 may be positioned on or in close proximity to the lower assembly 44 and may be in fluid communication with the bladder 48. In the illustrated embodiment, the bladder inflation system 62 includes at least one inlet 64 and at least one regulator 66. In one embodiment, the regulator 66 comprises a solenoid configured to permit and restrict the flow of fluid into and out of the bladder 48. Further, the bladder inflation system 62 includes at least one outlet 68. The bladder inflation system 62 may be detachably or non-detachably coupled to an inflation source (not shown). For example, in one embodiment, the bladder inflation system 62 is in fluid communication with at least one fluid pump included in the thermal control system 30 (See FIG. 2). As shown in FIG. 5, at least one clamp piston 60 is in communication with the bladder 48 via at least one clamp piston passage 92 formed in the clamp alignment body 50. As shown, the clamp piston passage 92 may include at least one clamp piston retaining relief 94 configured to engage and retain at least a portion of the clamp piston 60 therein proximate to the bladder 48. In addition, one or more biasing members 84 may be positioned proximate to at least one clamp piston 60 and retained within the clamp piston passage 92. One or more gap filling bodies 86 may be positioned proximate to the biasing members 84. The biasing member 84 is configured to bias the uninflated bladder 48 towards the clamp alignment body 50. During use, the bladder 48 is inflated with sufficient pressure to overcome the biasing force applied to the bladder 48 by the biasing member 84. As a result, the bladder 48 exerts a biasing force on the clamp piston 60 causing the clamp piston 60 to extend from the clamp alignment body 50. Further, as shown in FIGS. 3-5, one or more fasteners 88 and washers 90 may be used to couple the various components of the lower assembly 44. FIGS. 3-5 show a generally planar lower assembly 44. Those skilled in the art will appreciate that the lower assembly 44 and top assembly 70 may be manufactured in any variety of shapes, sizes, and configurations. For example, FIG. 6 shows an embodiment of an arcuate lower assembly 44, although those skilled in the art will appreciate that the lower assembly 44 may be manufactured in any variety of shapes, sizes, and/or configurations.

FIGS. 3 and 7-10 show various views of an embodiment of an upper assembly 70 for use in a high power laser diode test system 10. As shown, the upper assembly 70 includes at least one plate member 72 having one or more passages 74 formed therein. Further, at least one thermal control circuit 76 may be positioned on or proximate to the plate member 72. In one embodiment, the thermal control circuit 76 includes at least one fluid inlet 78, at least one fluid outlet 80, and at least one controller and/or coupler 82 configured to couple the fluid inlet 78 and outlet 80 to at least one thermal control system 30 (See FIG. 2) or other fluid source (not shown). Optionally, the controller 82 may be configured to control the flow of fluid or other materials used in the thermal control circuit 76. As such, the controller 82 may include sensors, thermocouples, chillers, heaters, coupling connectors, processors, valves, and the like. As such, the plate member 72 may be configured to operate as a cold plate dissipating heat generated by the at least one laser diode under test in addition to providing power to the laser diode under test. In the alternative, the plate member 72 may be configured to operate as a hot plate generating heat to thermally stress at least one laser diode under test in addition to providing power to the laser diode under test. As such, the thermal control circuit 76 permits the user to both heat and cool laser diode under test, permitting a complete analysis of thermal characteristics of the laser diode under test.

Referring again to FIGS. 7-9, the upper assembly 70 may include at least one electrical connection system. In the illustrated embodiment, a first electrical connection system 96 having one or more conduits configured to provide voltage, current (alternating current (AC) and/or direct current (DC)) to at least one laser diode device or other component coupled to the carrier device 20 is included. Optionally, one or more current sources, converter, sensors, and the like may be included within the electrical connection system 96. These localized current sources and/or similar systems may be in communication with the power supply 32. In addition, at least a second electrical connection system 128 may be included. For example, the second electrical connection system 128 may be coupled to one or more chillers, heaters, sensors, and the like. As such, the first and second electrical connection systems 96, 128 may be in communication with the power supply 32 positioned within the housing body 12 of the test system 10 (See FIG. 2). The electrical connection systems 96, 128 may be detachably or non-detachably coupled to the power supply 32 via the interconnect system 36. Further, the electrical connection systems 96, 128 may be coupled (detachably or non-detachably) to the system controller 34 shown in FIG. 2. In the illustrated embodiment, the first electrical connection system 96 includes a first conduit 98a and at least a second conduit 98b, although those skilled in the art will appreciate that any number or type of conduits may be used with either electrical connection systems 96, 128. In the illustrated embodiment, the first and second conduits 98a, 98b are coupled to at least one electrical connect body 136 via at least one conduit clamp body 134. In one embodiment, the electrical connect body 136 is configured to provide voltage and/or current to the at least one laser diode or other component coupled to the carrier device 20. The conduit clamp body 134 securely couples at least one conduit 98a, 98b to at least one electrical connect body 136. The second electrical connection system 128 may be configured to provide voltage and/or current to additional thermal control devices used in the test system 10, individual components under test, and/or other subsystems included within the test system 10 requiring a separate voltage and/or current source. Further, the electrical connection systems 96, 128 may include various other components known in the art, including, without limitations, connectors, voltage regulators, current regulators, converters, meters, sensors, capacitors, heaters, chillers, resistors, inductors, transformers, diodes, circuits, processors, memory devices, and the like. For example, in the illustrated embodiment, at least one connector 138 is coupled to the first and second conduits 98a, 98b, thereby permitting the electrical connection system 96 to be quickly and easily coupled to the interconnect system 36 (See FIG. 2).

Figure 8:
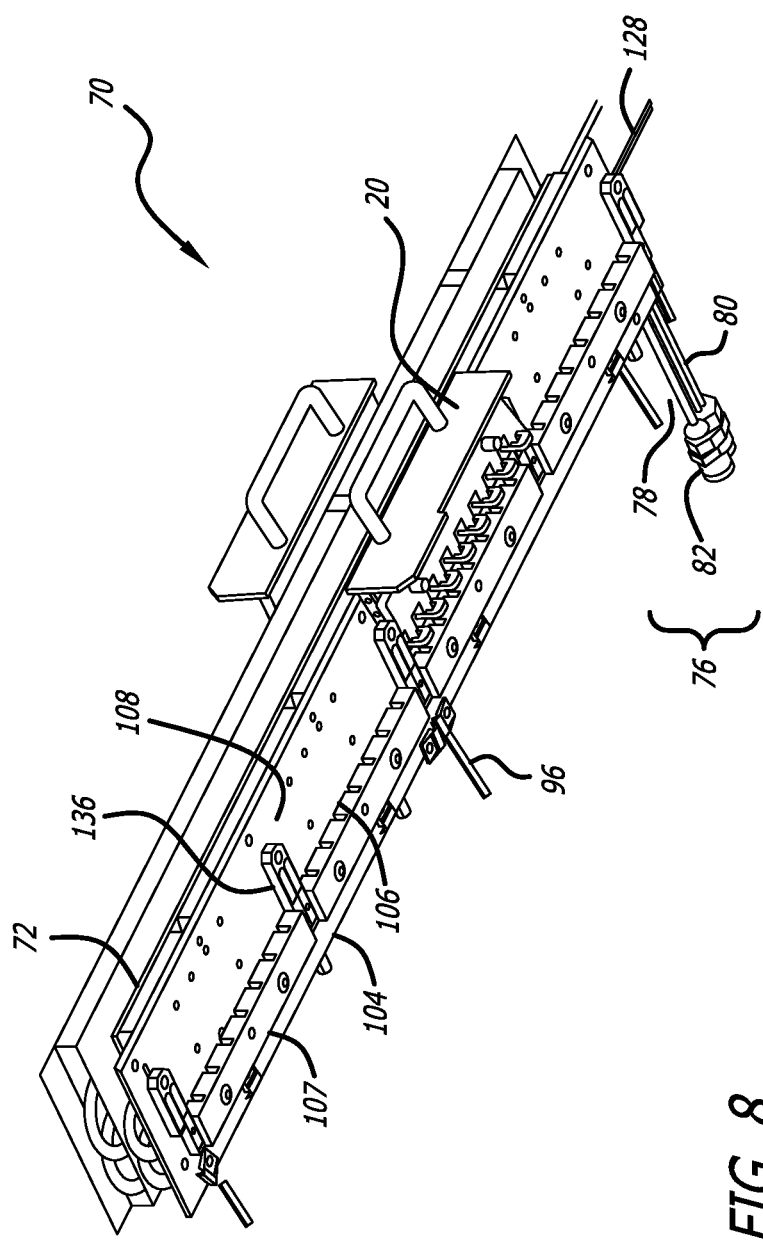
FIG. 8 shows a perspective view of an embodiment of an upper assembly of the device test module shown in FIG. 3.
Figure 9:
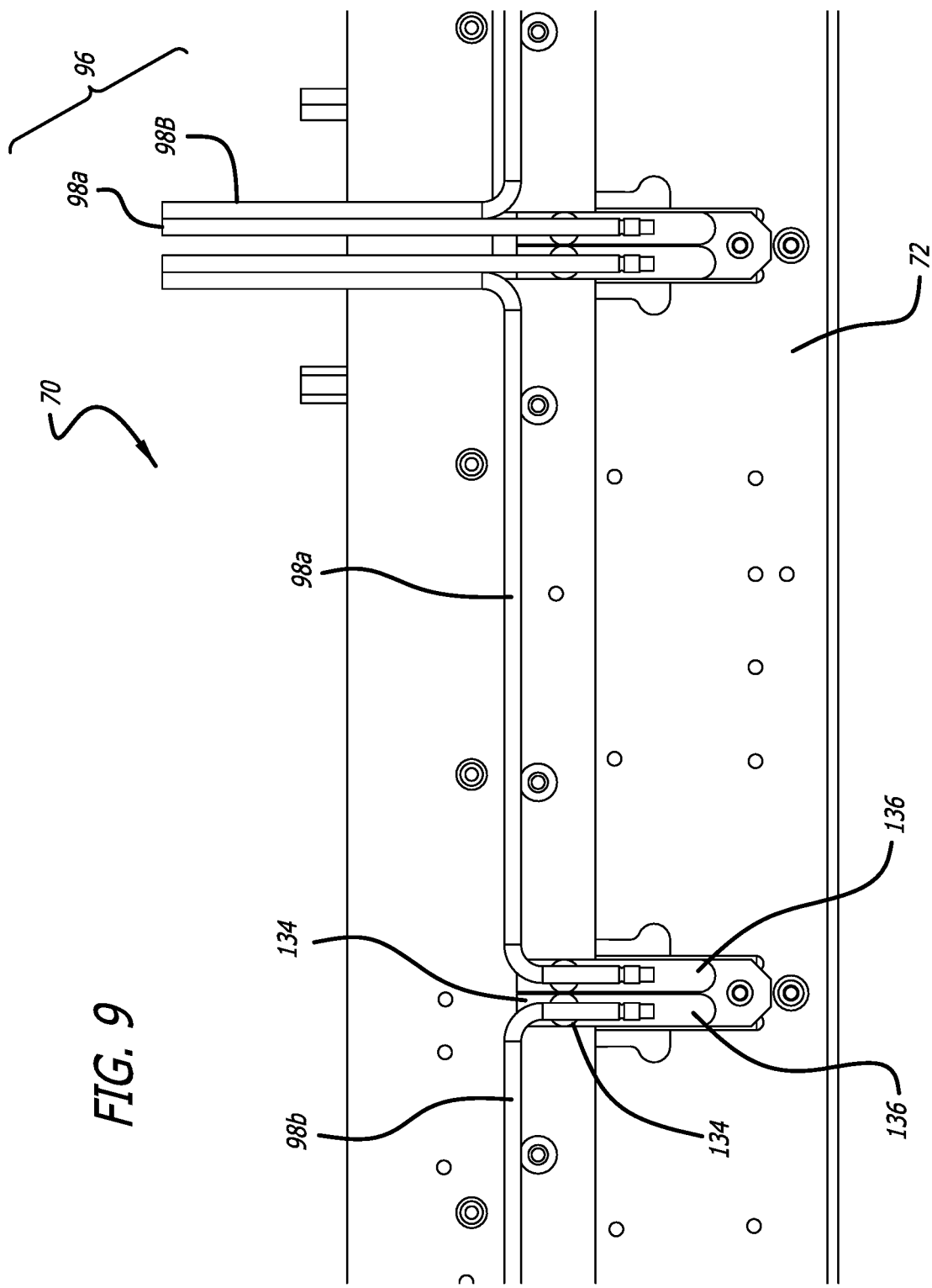
FIG. 9 shows a top planar view of an embodiment of an electrical connect body positioned on the upper assembly shown in FIG. 3.
Figure 10:
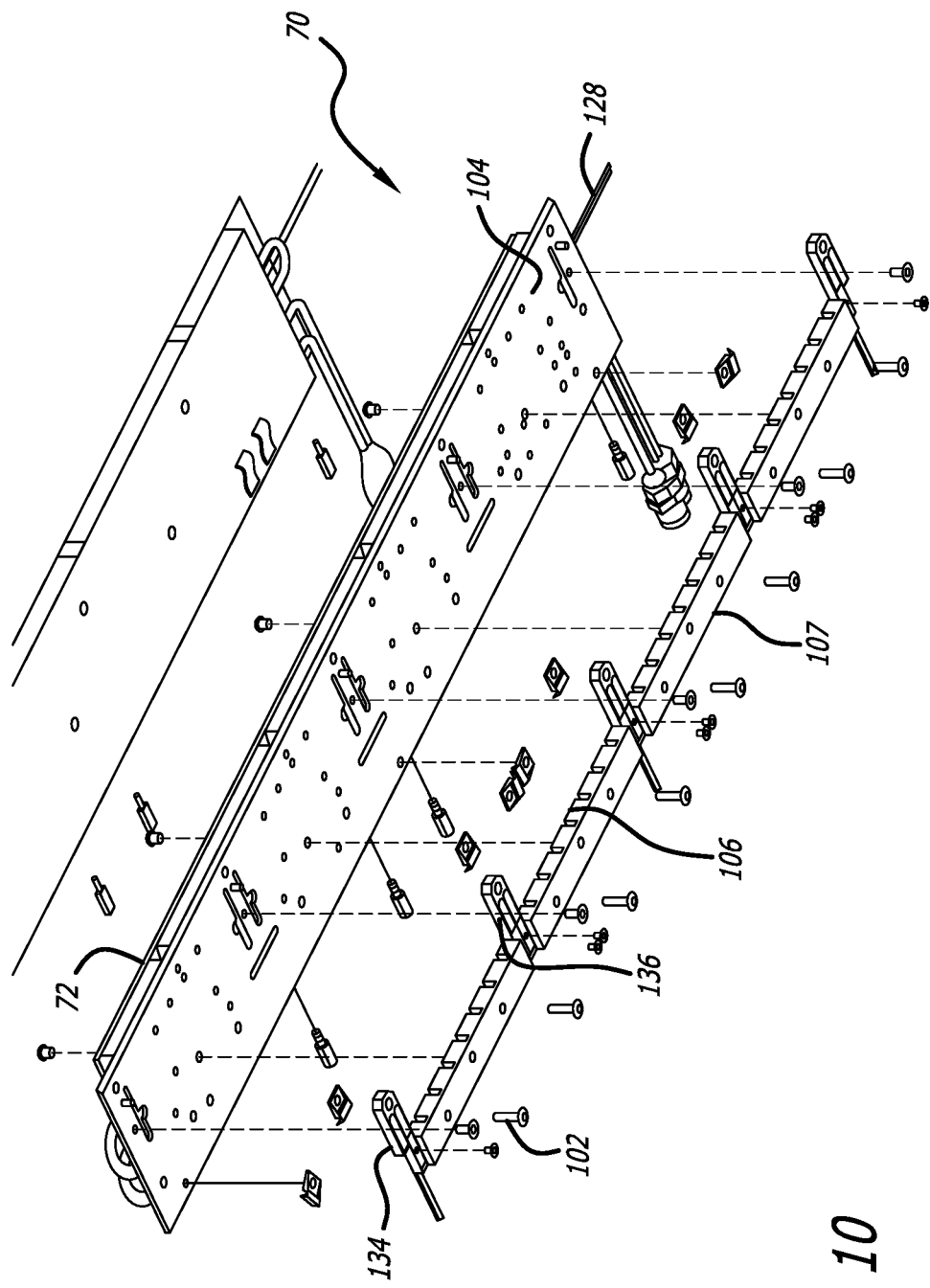
FIG. 10 shows an exploded perspective view of the components forming the embodiment of the upper assembly in FIG. 3.
Figure 11:
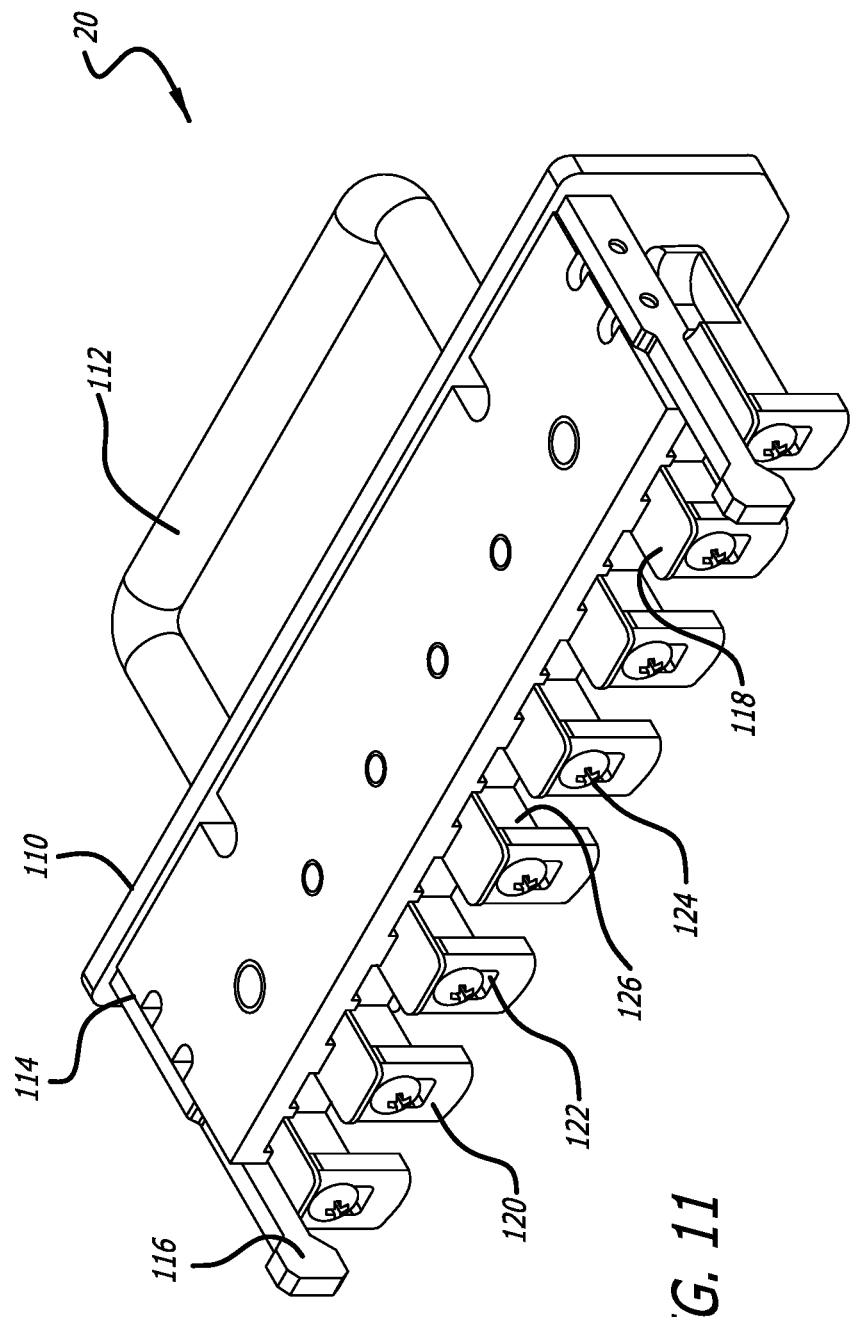
FIG. 11 shows an elevated perspective view an embodiment of a carrier device for use with a device test module.
Figure 12:
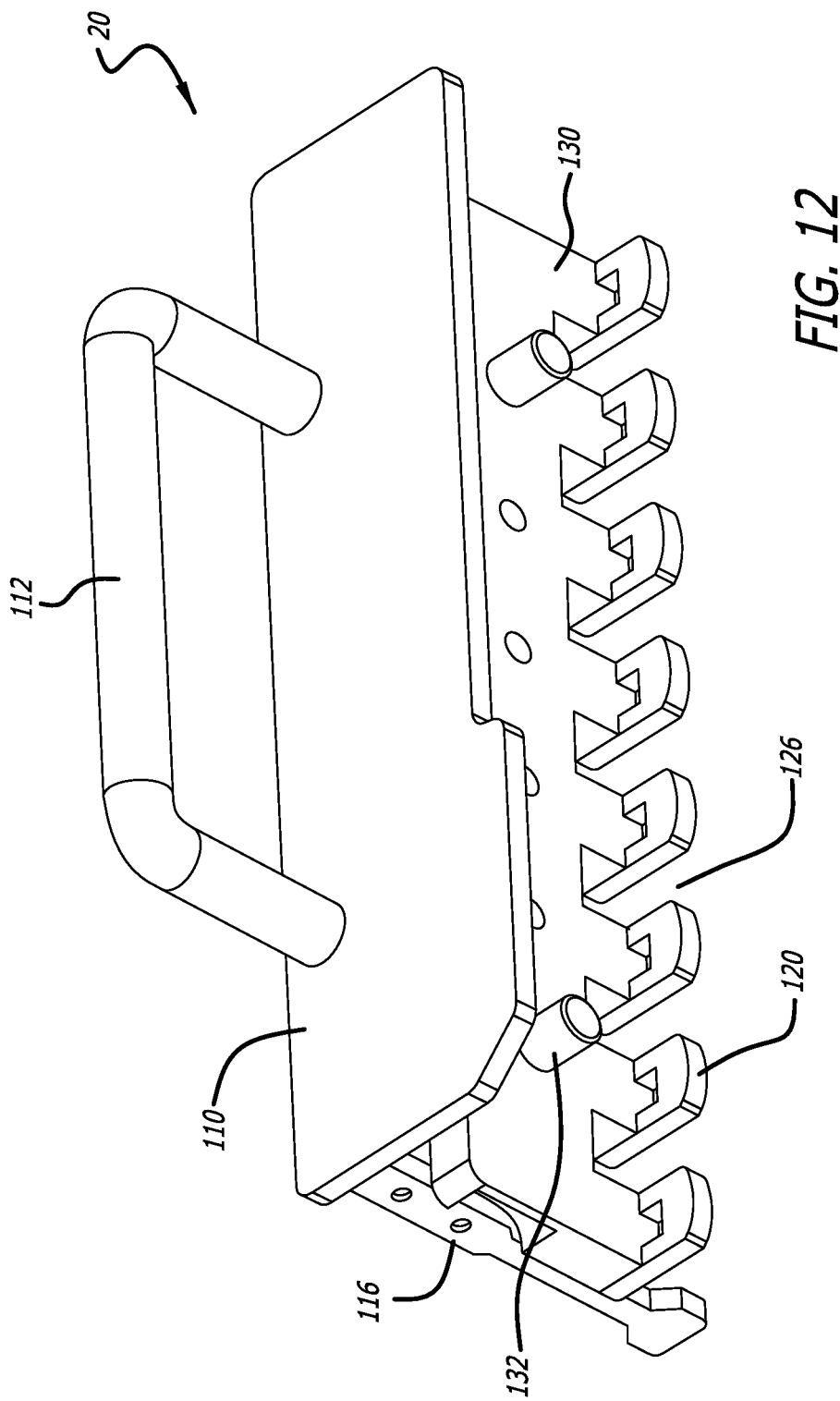
FIG. 12 shows a perspective view an embodiment of the carrier device shown in FIG. 11 for use with a device test module.
Figure 13:
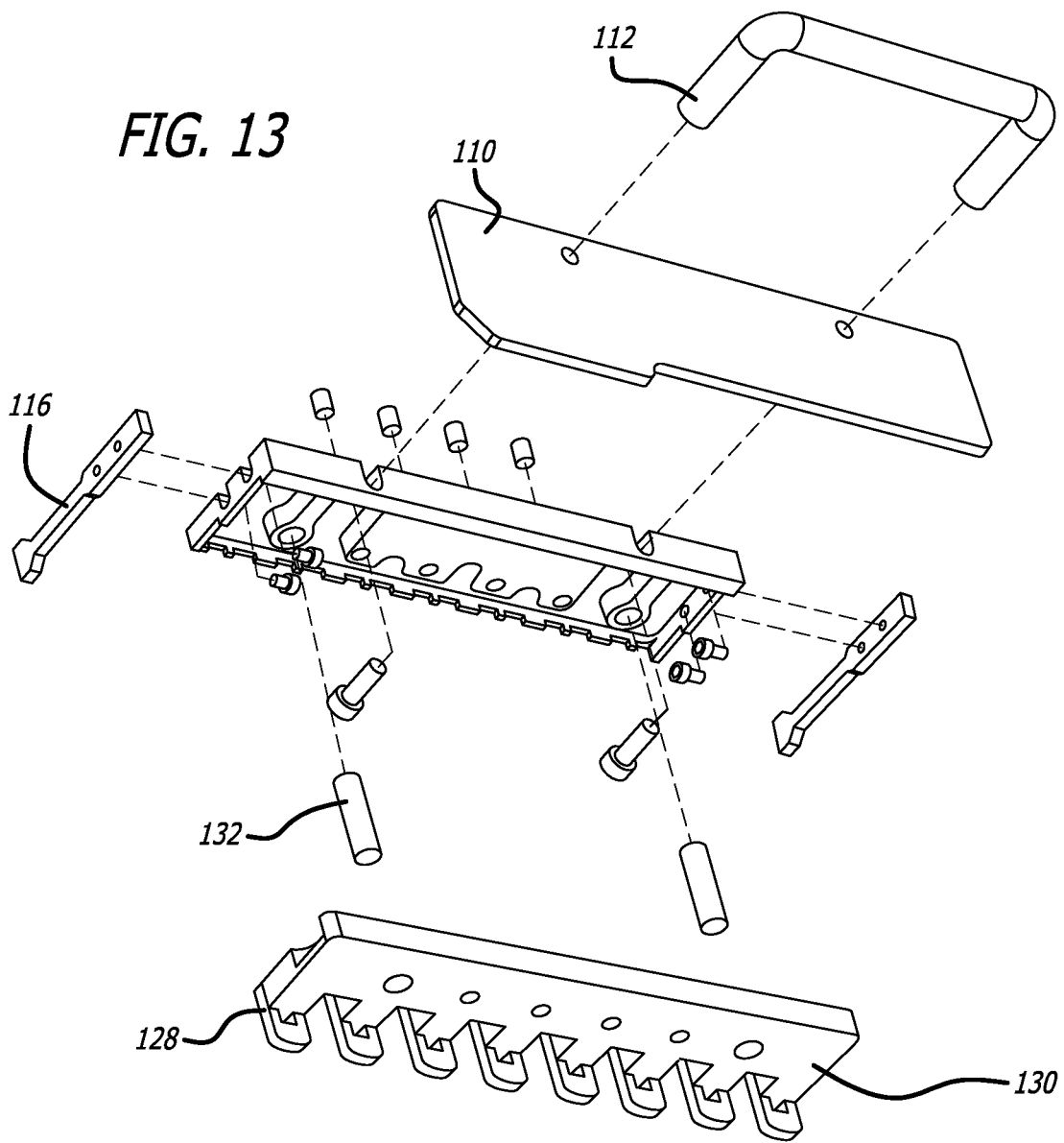
FIG. 13 shows an exploded perspective view of the components forming the embodiment of the carrier device in FIG. 11.

FIGS. 8 and 10 show various views of the underside of the upper assembly 70. As shown, upper assembly plate 104 may be coupled to the plate member 72. In one embodiment, the upper assembly plate 104 is manufactured from a material having high thermal conductivity, thereby enhancing the heat exchange between the laser diode (not shown) and the thermal control circuit 76. Further, one or more beam dumps or sensors 106 may be coupled to at least one of the plate member 72 and upper assembly plate 104. For example, in one embodiment numerous beam dumps 106 used to receive and dissipate energy emitted from the laser diodes 140. In another embodiment, at least one of the beam dumps 106 may comprise at least one sensor, such as a power meter, wavelength sensor, and the like. As such, the thermally conductive upper assembly plate 104 may be configured to extract heat from the beam dumps 106. Optionally, the upper plate assembly 104 may be in communication with the thermal control circuit 76. As such, at least a portion of the upper plate assembly 104 may act as a cold plate. In the illustrated embodiment, at least one thermal regulating body 107 is positioned proximate to the beam dumps 106 and configured to further extract heat from the beam dumps 106 during use. For example, the thermal regulating body 107 may comprise at least one cold plate in contract with or in close proximity to the beam dumps 106. As such, the thermal regulating body 107 may be in communication with the thermal control circuit 76. Further, in the illustrated embodiment the plate member 72, upper plate assembly 104, and beam dumps 106 are configured to cooperatively form carrier device receivers 108 sized to receive at least one carrier device 20 (See FIG. 1) therein. The carrier devices receivers 108 may be in communication with and positioned proximate to the carrier device port 42 formed on the device test module faceplate 40. Those skilled in the art will appreciate, however, the beam dumps 106 may be formed in any variety of shapes and configurations. In the illustrated embodiment, the beam dumps 106 are coupled to the upper assembly plate 104 using one or more fasteners 102, although those skilled in the art will appreciate that the beam dumps may be coupled to the upper assembly plate 104 using any variety of coupling devices or techniques.

FIGS. 3 and 11-13 show various views of an embodiment of a carrier device 20 for use in a high power laser diode test system 10. As shown, the carrier device 20 may include at least one carrier device faceplate 110 having one or more handles or gripping surfaces 112 formed thereon or coupled thereto. Further, at least one device positioning member 114 may be included with or coupled to at least a portion of the carrier device 20. One or more end plates 116 may be used to define at least one device receiving area. In addition, one or more contact device bodies 118 may be coupled to or positioned proximate to the device positioning member 114. In one embodiment, the contact device body 118 is configured to permit a voltage and/or current to be provided to one or more laser diode devices 140 (See FIGS. 14-16) positioned on the carrier device 20. As such, at least one contact device body 118 may be configured to engage and form a conduct contact with at least one electrical connect body 136 positioned on the upper assembly 70 (See FIGS. 7-10).

Referring again to FIGS. 3 and 11-13, the carrier device 20 includes one or more carrier device bodies 130. In the illustrated embodiment, at least one carrier device piston 120 having at least one fastener passage 122 formed therein may be movable coupled to the carrier device body 130 using one or more fasteners 124. In the illustrated embodiment, the fastener passage 122 comprises an elongated channel configured to receive the fastener 124 there through, the fastener 124 configured to engage and be retained within the carrier device body 130. For example, the carrier device piston 120 may be configured to be move in along at least one of the X axis, Y axis, and Z axis. As such, the movable carrier device pistons 120 may be configured to engage the contact device bodies 118. For example, inflation of the bladder 48 may result in the clamp piston 60 engaging the carrier device piston 120 such that the carrier device piston 120 engages and the contact body 118. As a result, the carrier device 20 may be mechanically coupled to the device test module 18 by the transmission of a biasing or coupling force from the inflated bladder 48 to the carrier device 18 via the carrier device piston 120. Further, the force imparted by the carrier device piston 120 may force at least a portion of the contact device body 118 in contact with at least one electrical connect body 136 located on the upper assembly 70, thereby providing voltage, current, or both at least one laser diode coupled to the carrier device 20. In addition, the force imparted by the carrier device piston 120 when the bladder 48 is inflated may ensure that at least portion of the carrier device 20 or the various components thereof may be in contact with at least the upper plate assembly 70, thermal regulating body 107, or both thereby providing thermal coupling of the carrier device 20 or the laser diode device 140 positioned thereon, thereby permitting the laser diode 140 or other component coupled to the carrier device 20 to be effectively and efficiently heated or cooled during operation. As such, the carrier device pistons 120 may be used to mechanically, thermally, and/or electrically coupling the carrier device 20 to the device test module 18. In one embodiment, at least one carrier relief 126 is formed between the numerous carrier device pistons 120, although those skilled in the art will appreciate that the carrier device 20 may be manufactured without a carrier relief 126. One or more assembly guides or pins 132 may optionally be included on the carrier device body 130.

Figure 14:
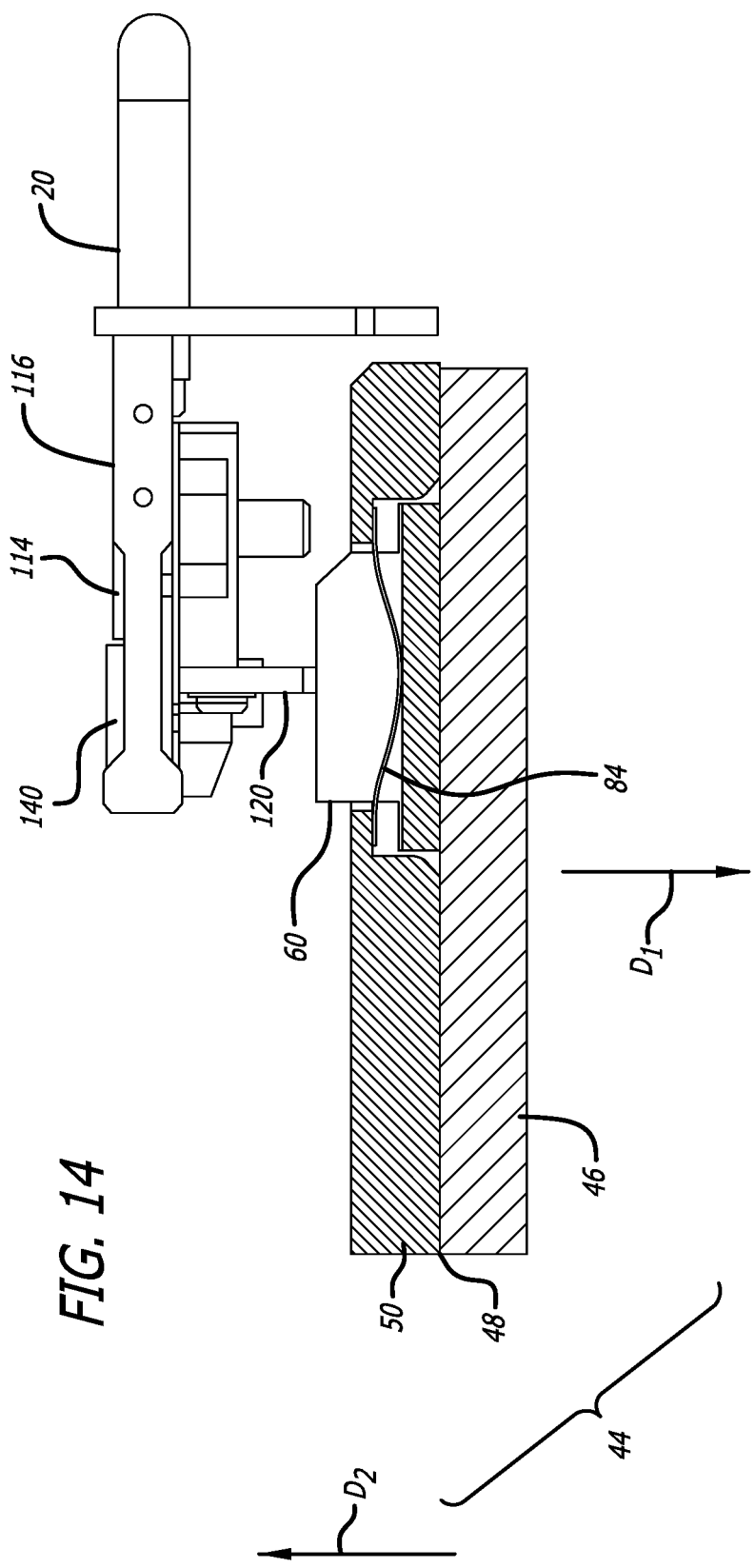
FIG. 14 shows a planar side cross-sectional view of an embodiment of a carrier device positioned proximate to an embodiment of a lower assembly of a device test module.
Figure 15:
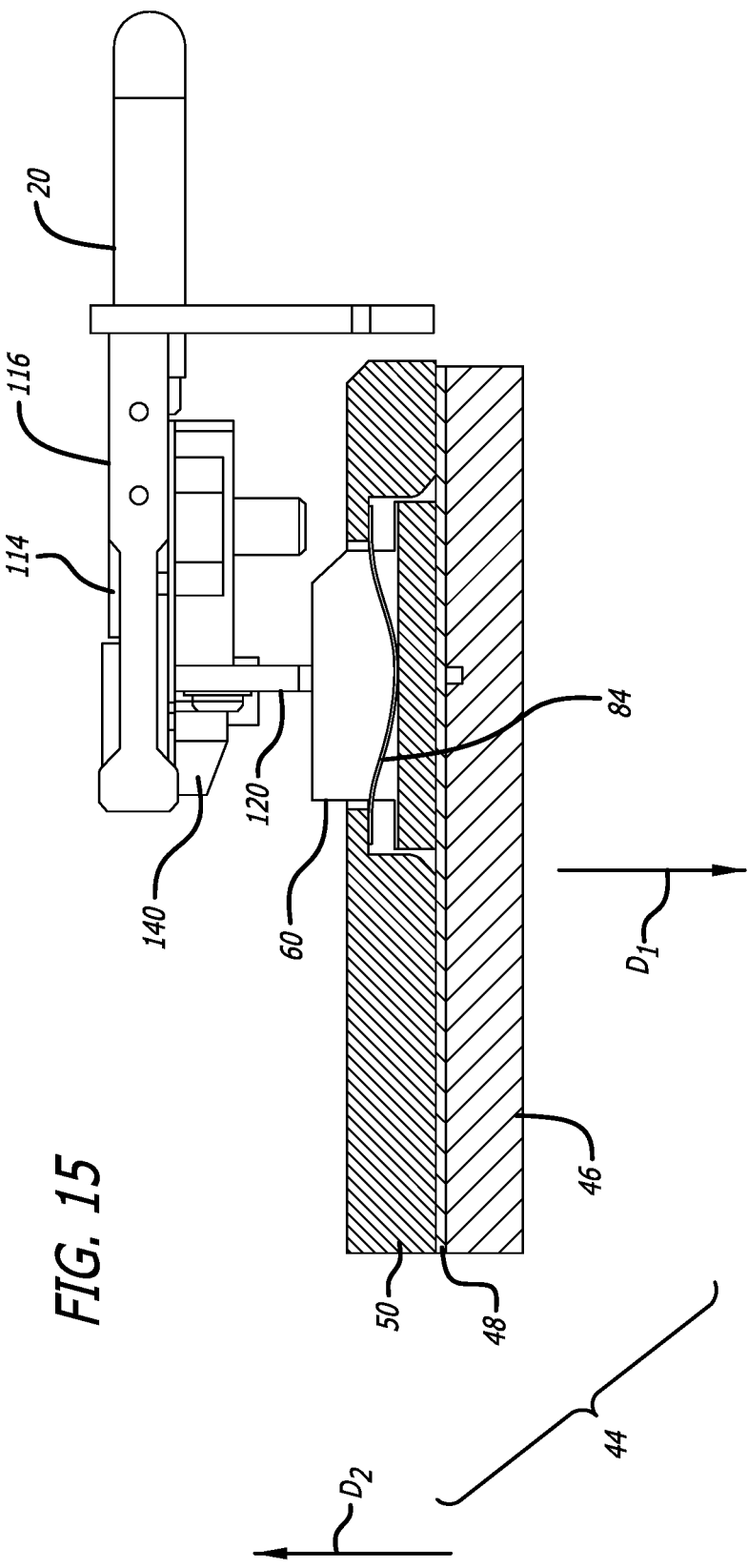
FIG. 15 shows another planar side cross-sectional view of an embodiment of a carrier device positioned proximate to an embodiment of a lower assembly of a device test module.
Figure 16:
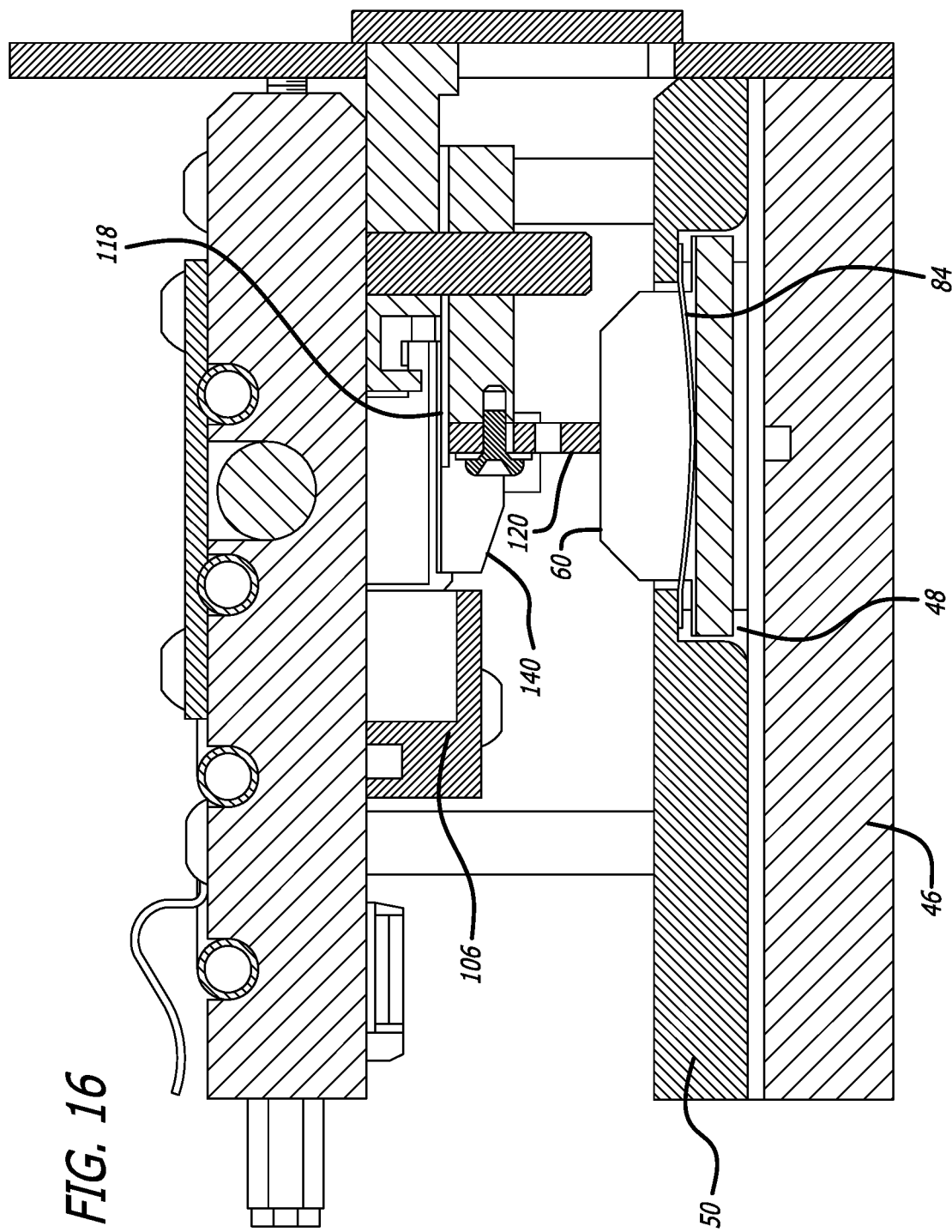
FIG. 16 shows another planar side cross-sectional view of an embodiment of a carrier device positioned an embodiment of a device test module.
Figure 17:
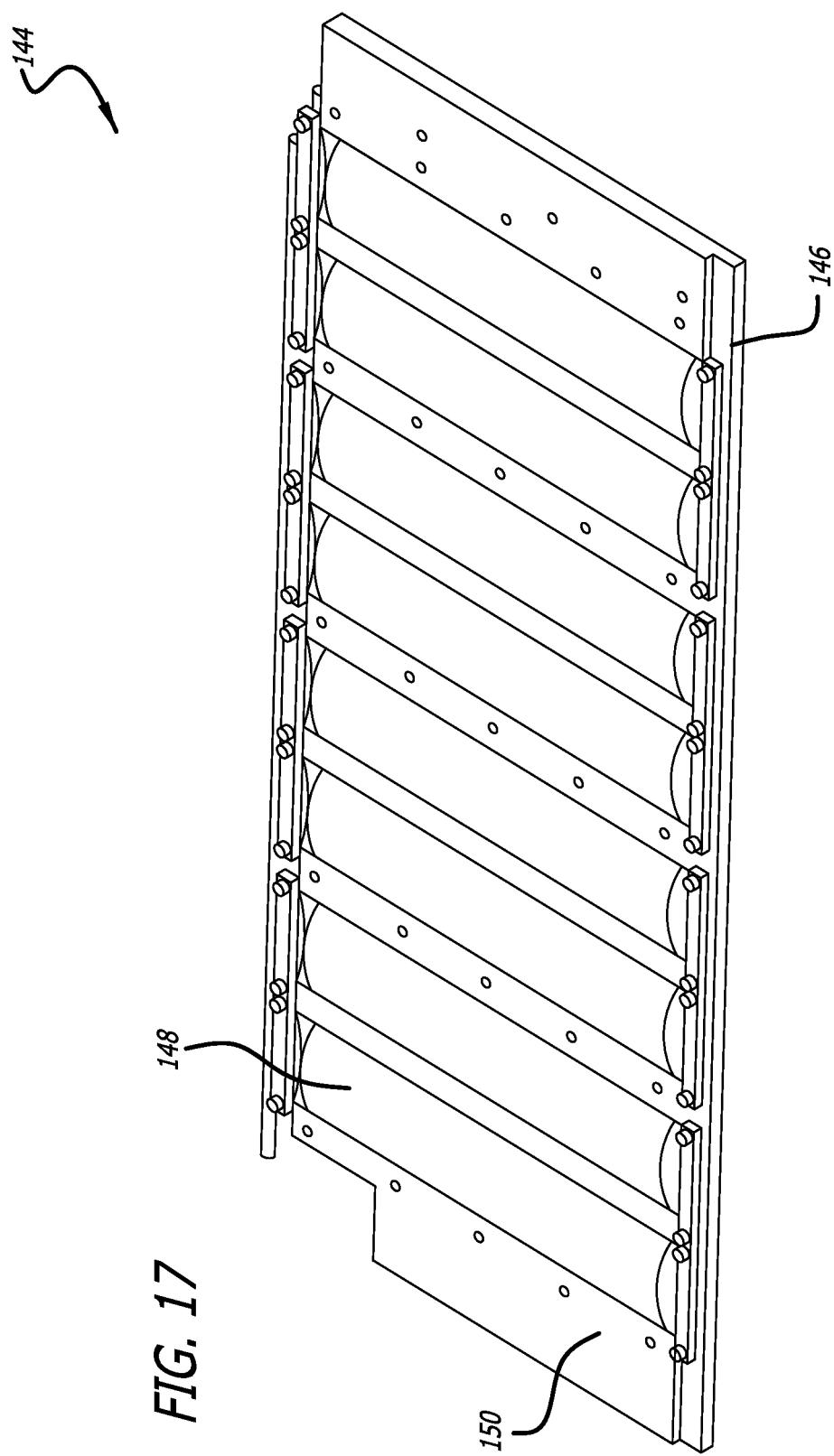
FIG. 17 shows an elevated perspective view of an alternate embodiment of a clamp base plate having multiple bladders therein used in a lower assembly of a device test module.
Figure 18:
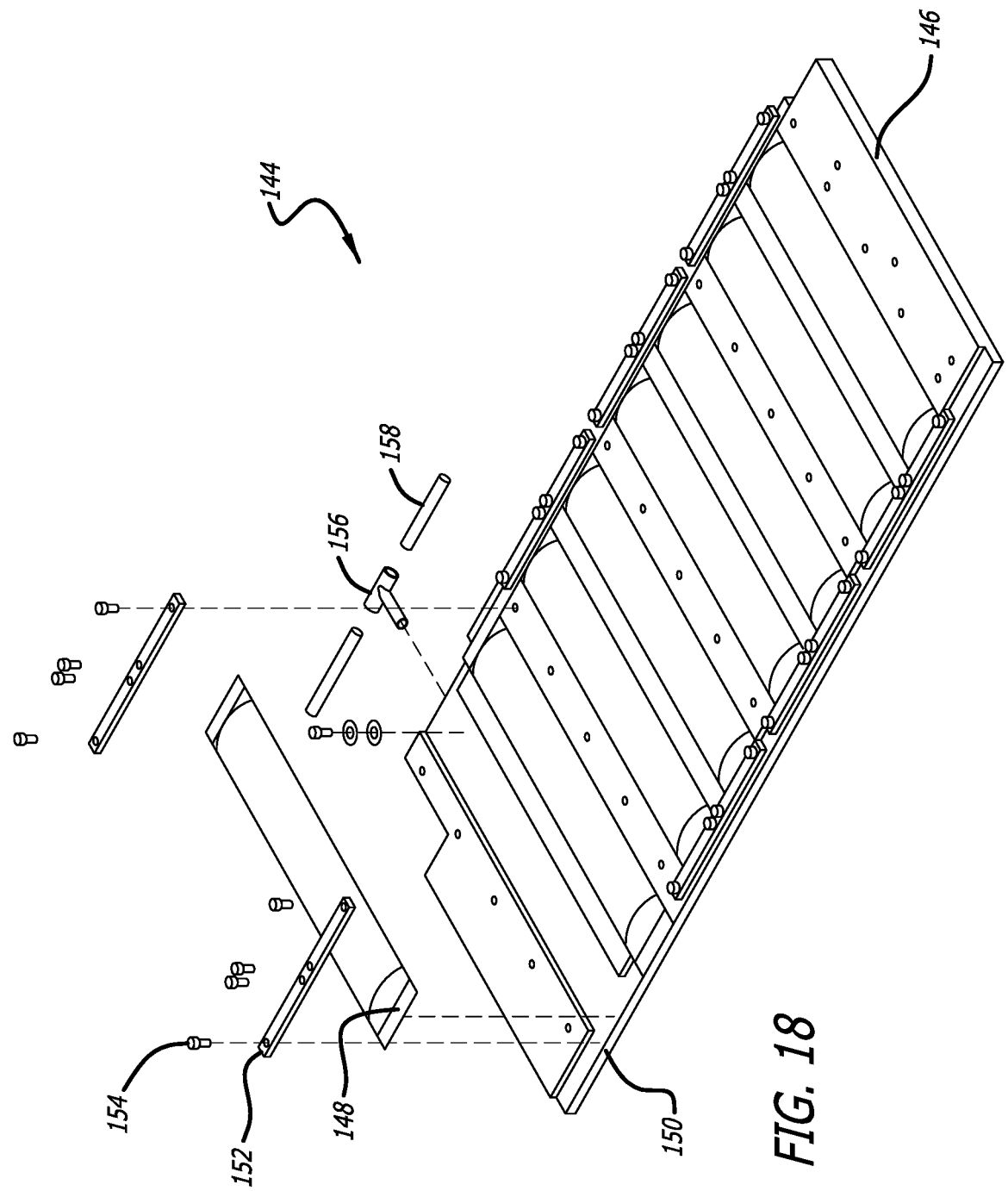
FIG. 18 shows an exploded perspective view of the embodiment of the clamp base plate having multiple bladders therein used in a lower assembly of a device test module shown in FIG. 17.

FIGS. 14-16 show various views of the various components of the of the test system 10 during use. For example, FIGS. 14-16 shows a cross sectional view of the carrier device 20 positioned proximate to the lower assembly 44. As shown, the biasing member 84 located in the lower assembly 44 applies at least one biasing force to the clamp piston 60 in a first direction $D_1$. As such, the carrier device 20 can be easily inserted into and removed from the device test module 18 while the bladder 48 is deflated. During use, the bladder 48 is inflated with sufficient pressure to overcome the biasing force of the biasing member 84. As a result, the clamp piston 60 is moved in a second direction $D_2$, thereby resulting the in clamp piston 60 engaging the carrier device piston 120 located on the carrier device 20. Together, the clamp piston 60 located in the lower assembly 44 and carrier device piston 120 located on the carrier device 20 cooperatively apply a dynamic clamping force, which is substantially equally applied to by all the clamp pistons 60 to carrier device pistons 120 on the carrier devices positioned proximate thereto, thereby securely coupling the carrier device 20 to the at least a portion of the contact device 118. In addition, the contact device 118 may be made to contact the electrical connect body 136 formed on upper assembly 70. As a result, the laser diode device 140 positioned on the carrier device 20 may be powered by the power supply 32 of the test system 10 (See FIG. 2) via the electrical connection system 96. The optical radiation emitted from the laser diode device 140 is directed into the beam dumps 106. Heat generated by the operation of the laser diode 140 may then be dissipated and/or extracted via the thermal control circuit 76. Once the testing of the laser diode device 140 is completed, the voltage and/or current connection between the power supply 32 and the laser diode device 140 is terminated. Thereafter, the bladder 46 may be deflated and the carrier device 20 may easily be removed from the device test module 18.

FIGS. 17-20 show an alternate embodiment of a clamp base plate of the lower assembly 144 and at least one upper assembly 70 shown in FIGS. 7-10. As shown, the clamp base plate 146 having multiple bladder bodies 148 positioned thereon. In one embodiment, the bladder bodies 148 comprise compliant bodies. For example, the bladder bodies 148 may comprise sections of Kevlar protected hose, thereby providing a durable compliant bladder body capable of withstanding considerable wear and tear during use. In another embodiment, the bladder bodies 148 may comprise polymer bodies. Those skilled in the art will appreciate that the bladder bodies 148 may be manufactured from any variety of materials in any variety of shapes and transverse dimensions. One or more bladder support bodies 150 are positioned proximate to the bladder bodies 148. Further, one or more bladder clamp devices 152 maybe used to couple the bladder bodies 148 to the clamp base plate 146. Further, the bladder clamp devices 152 may be used to seal the bladder body 148, thereby forming a bladder envelope. In one embodiment, one or more fasteners 154 may be used to couple the bladder support bodies 150 and bladder clamp devices 152 to the clamp base plate 146. One or more valves or connectors 156 and conduits 158 may be used to couple the bladder bodies 148 to one or more fluid sources (not shown), thereby permitting the bladder bodies 148 to be selectively inflated and deflated. In one embodiment, the each bladder body 148 may be uniformly inflated and deflated by the a fluid source (not shown) and/or the bladder inflation system 62 of the lower assembly 44

Figure 19:
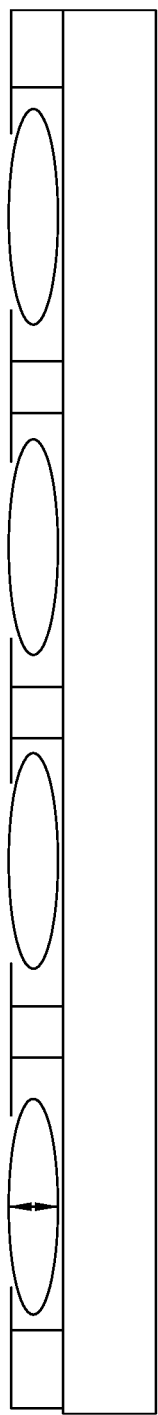
FIG. 19 shows side cross-sectional view of the embodiment of the clamp base plate having multiple deflated bladders therein used in a lower assembly of a device test module shown in FIG. 17.
Figure 20:
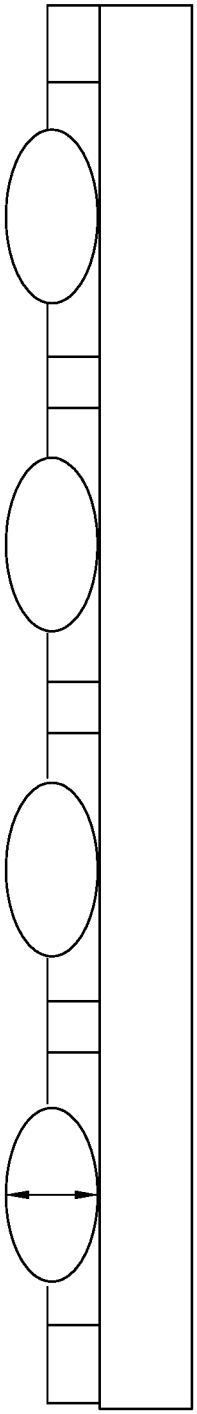
FIG. 20 shows side cross-sectional view of the embodiment of the clamp base plate having multiple inflated bladders therein used in a lower assembly of a device test module shown in FIG. 17.

As shown in FIG. 19, the bladder bodies 148 may be used in a deflated state thereby resulting in the bladder bodies 148 retracting proximate to the clamp base plate 146. As such, when the lower assembly 144 shown in FIGS. 17-20 is used in the device test module 18 shown in FIG. 3, the carrier device 20 may be easily inserted into and removed from the device test module 18. In contrast, as shown in FIG. 3, the user may position one or more carrier devices 20 in the device test module 18. Thereafter, as shown in FIG. 20, the user may inflate the bladder bodies 148 coupled to the clamp base plate 146 of the lower assembly 144, thereby resulting in the bladder bodies 148 inflating and extending from the clamp base plate 146. The bladder bodies 144 would then apply a clamping force to the carrier device 20 positioned within the test module 18. In one embodiment, each bladder body 148 is configured to be inflated to substantially the same pressure, thereby applying the same clamping force to the carrier device 20. In another embodiment, each bladder body 148 is configured to be inflated to substantially different pressure, thereby each bladder body 148 applying a different clamping force to the carrier device 20.

The embodiments disclosed herein are illustrative of the principles of the invention. Other modifications may be employed which are within the scope of the invention. Accordingly, the devices disclosed in the present application are not limited to that precisely as shown and described herein.

What is claimed is:

1. A high power laser diode test system, comprising:
   at least one housing body defining at least one device test module compartment formed within the at least one housing body;
   at least one power supply positioned within the at least one device test module compartment;
   at least one interconnect system positioned within the at least one device test module compartment, the interconnect system in communication with the at least one power supply;
   at least one system controller positioned within the at least one device test module compartment, the system controller in communication with the at least one power supply via the at least one interconnect system;
   at least one thermal control system within the at least one device test module compartment, the thermal control system in communication with at least one of the at least one power supply and the at least one system controller via the at least one interconnect system;
   at least one device test module configured to be positioned within the at least one device test module compartment and in communication via the at least one interconnect system with at least one of the at least one power supply, the at least one system controller, and the at least one thermal control system, the at least one device module having a defining at least one carrier device port therein; and
   at least one carrier device configured to support at least one laser diode device detachably coupled thereon, the at least one carrier device in communication with at least one of the at least one power supply, the at least one system controller, and the at least one of the thermal control system via the at least one device test module.

2. The high power laser diode test system of claim 1 wherein the device test module is detachably coupled to the interconnect system.

3. The high power laser diode test system of claim 1 wherein the device test module further comprises:
   at least one lower assembly having at least one clamp base plate, at least one clamp alignment body, and at least one bladder positioned between the at least one clamp base plate and the at least one clamp alignment body;
   at least one least one bladder inflation system in fluid communication with and configured to selectively inflate the at least one bladder of the at least one lower assembly, the at least one bladder inflation system in communication with the at least one power supply via the at least one interconnect system; and
   at least one upper assembly positioned proximate to the at least one lower assembly, the at least one upper assembly having at least one thermal control circuit and at least one electrical connection system thereon, wherein the at least one lower assembly and the at least one upper assembly form at least one carrier device receiver configured to receive at least carrier device therein.

4. The high power laser diode test system of claim 3 further comprising at least one clamp piston movably positioned within and retained by at least one piston passage formed in the at least one clamp alignment body, the at least one clamp piston is communication with the at least one bladder.

5. The high power laser diode test system of claim 4 further comprising at least one biasing member positioned proximate to the at least one clamp piston, the at least one biasing member configured to apply at least one biasing force to the at least one clamp piston, the at least one biasing member configured to retract the clamp piston towards the clamp alignment body.

6. The high power laser diode test system of claim 5 wherein the at least one clamp piston is configured to extend from the at least one bladder when the bladder is inflated.

7. The high power laser diode test system of claim 3 wherein the at least one upper receiver includes at least one at least one electrical connect body coupled to the at least one electrical connection system, at least a portion of the at least one electrical connect body positioned within the at least one carrier device receiver during use.

8. The high power laser diode test system of claim 3 wherein the at least one upper receiver includes at least one thermal regulating body positioned proximate to the carrier device receiver, the at least one thermal regulating body in communication with the at least one thermal control system via the at least one interconnect system.

9. The high power laser diode test system of claim 8 further comprising at least one beam dump positioned on the at least one upper assembly proximate to the at least one thermal regulating body, the at least one beam dump configured to receive and dissipate optical radiation emitted by at least one laser diode positioned on the carrier device.

10. A device test module for use within a high power laser diode test system, the device test module comprising:
   at least one device test module faceplate configured to be coupled to a high power laser diode test system, the at least one device test module faceplate defining at least one carrier device port;
   at least one lower assembly coupled to the at least one device test module faceplate, the at least one lower assembly having at least one clamp base plate, at least one clamp alignment body, and at least one bladder positioned between the at least one clamp base plate and the at least one clamp alignment body;
   at least one least one bladder inflation system in fluid communication with and configured to selectively inflate the at least one bladder of the at least one lower assembly, the at least one bladder inflation system in communication with at least one power supply coupled to a high power laser diode test system;
   at least one upper assembly coupled to the at least one device test module faceplate and positioned proximate to the at least one lower assembly, the at least one upper assembly having at least one thermal control circuit and at least one electrical connection system thereon, wherein the at least one lower assembly and the at least one upper assembly form at least one carrier device receiver configured to receive at least carrier device therein; and at least one carrier device configured to have at least one laser diode coupled thereto wherein the laser diode is detachably coupled to the at least one electrical connection system of the at least one upper assembly.

11. The device test module of claim 10 wherein the at least one bladder comprises a single bladder positioned between the at least one clamp base plate and at least one clamp alignment body.

12. The device test module of claim 10 wherein the at least one bladder comprises a multiple bladders positioned each between the at least one clamp base plate and at least one clamp alignment body wherein each bladder is coupled to and selectively inflated by the at least one least one bladder inflation system.

13. The device test module of claim 10 further comprising at least one clamp piston movably positioned within and retained by at least one piston passage formed in the at least one clamp alignment body, the at least one clamp piston is communication with the at least one bladder.

14. The device test module of claim 13 further comprising at least one biasing member positioned proximate to the at least one clamp piston, the at least one biasing member configured to apply at least one biasing force to the at least one clamp piston, the at least one biasing member configured to retract the clamp piston towards the clamp alignment body.

15. The device test module of claim 13 wherein the at least one clamp piston is configured to extend from the at least one bladder when the bladder is inflated.

16. The device test module of claim 10 wherein the at least one upper receiver includes at least one at least one electrical connect body coupled to the at least one electrical connection system, at least a portion of the at least one electrical connect body positioned within the at least one carrier device receiver during use.

17. The device test module of claim 10 wherein the at least one upper receiver includes at least one thermal regulating body positioned proximate to the carrier device receiver.

18. The device test module of claim 17 further comprising at least one beam dump positioned on the at least one upper assembly proximate to the at least one thermal regulating body such that the at least one thermal regulating body regulates the thermal characteristics of the at least one beam dump, the at least one beam dump configured to receive and dissipate optical radiation emitted by at least one laser diode positioned on the carrier device.

19. The device test module of claim 17 further comprising:

at least one carrier device having at least one carrier device faceplate coupled to at least one carrier device body;

at least one device positioning member coupled to at least one of the at least one carrier device faceplate and the at least one carrier device body, the at least one device positioning member configured to have one or more laser diodes detachably coupled thereto;

at least one carrier device piston movable coupled to the carrier device body, the at least one carrier device piston configured engage at least a portion of at least one clamp piston positioned on the at least one lower assembly; and at least one contact device body configured to be selectively engaged by the carrier device piston when the at least one bladder is inflated, the at least one contact device configured to selectively couple carrier device to the to the device test module.

20. The device test module of claim 19 wherein the at least one contact device body is configured to mechanically couple the at least one carrier device to the device test module.

21. The device test module of claim 19 wherein the at least one contact device body is configured to thermally couple the at least one carrier device to the at least one upper assembly of the device test module.

22. The device test module of claim 19 wherein the at least one contact device body is configured to electrically couple the at least one carrier device to the at least one electrical connect body positioned on the at least one upper assembly of the device test module.

23. A carrier device for use in a high power laser diode test system, the carrier device comprising:

at least one carrier device faceplate coupled to at least one carrier device body;

at least one device positioning member coupled to at least one of the at least one carrier device faceplate and the at least one carrier device body, the at least one device positioning member configured to have one or more laser diodes detachably coupled thereto;

at least one carrier device piston movable coupled to the carrier device body, the at least one carrier device piston configured engage at least a portion of a device test module; and at least one contact device body configured to be selectively engaged by the at least one carrier device piston and engage at least one upper plate assembly within the device test module thereby coupling the at least one carrier device to the device test module.

24. The device test module of claim 23 wherein the at least one contact device body is configured to mechanically couple the at least one carrier device to the device test module.

25. The device test module of claim 23 wherein the at least one contact device body is configured to thermally couple the at least one carrier device to at least one upper assembly of the device test module.

26. The device test module of claim 23 wherein the at least one contact device body is configured to electrically couple the at least one carrier device to at least one electrical connect body positioned on at least one upper assembly of the device test module.

* * * * *